(12) United States Patent
Wu et al.

(10) Patent No.: US 11,638,380 B2
(45) Date of Patent: Apr. 25, 2023

(54) ILLUMINATION APPARATUS CAPABLE OF ILLUMINATING DIFFERENT LIGHTING PATTERNS

(71) Applicant: Au Optronics Corporation, Hsinchu (TW)

(72) Inventors: Hsin-Hui Wu, New Taipei (TW); Kuan-Heng Lin, Kaohsiung (TW); Meng-Ting Lee, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 53 days.

(21) Appl. No.: 16/517,680

(22) Filed: Jul. 22, 2019

(65) Prior Publication Data

US 2020/0035937 A1 Jan. 30, 2020

Related U.S. Application Data

(60) Provisional application No. 62/703,067, filed on Jul. 25, 2018.

(30) Foreign Application Priority Data

Nov. 20, 2018 (TW) .................................. 107141191

(51) Int. Cl.
*H10K 50/11* (2023.01)
*H10K 50/852* (2023.01)

(52) U.S. Cl.
CPC ........... *H10K 50/11* (2023.02); *H10K 50/805* (2023.02); *H10K 50/852* (2023.02); *H10K 50/858* (2023.02)

(58) Field of Classification Search
CPC ............. H01L 51/5012; H01L 51/5265; H01L 51/5203; H01L 51/5275; H01L 51/50; H01L 51/5271
See application file for complete search history.

(56) References Cited

U.S. PATENT DOCUMENTS

| 9,231,042 B2 | 1/2016 | Nishido et al. |
| 2003/0044587 A1* | 3/2003 | Lu ....................... H01L 51/5203 428/209 |

(Continued)

FOREIGN PATENT DOCUMENTS

| CN | 103985733 | 8/2014 |
| CN | 107300146 | 10/2017 |

(Continued)

*Primary Examiner* — Didarul A Mazumder
*Assistant Examiner* — Gustavo G Ramallo
(74) *Attorney, Agent, or Firm* — JCIPRNET

(57) ABSTRACT

An illumination apparatus including a transparent substrate, an opposite substrate and an electroluminescence structure disposed between the transparent substrate and the opposite substrate is provided. The transparent substrate has a first region and a second region adjacent to the first region. The electroluminescence structure is disposed on the transparent substrate. The electroluminescence structure includes a first electrode disposed in the first region, an optical adjusting layer disposed in the second region, an organic electroluminescence layer disposed above the first electrode and the optical adjusting layer and a common electrode disposed above the organic electroluminescence layer. The optical adjusting layer is disposed between the organic electroluminescence layer and the transparent substrate.

10 Claims, 9 Drawing Sheets

(56) References Cited

U.S. PATENT DOCUMENTS

| | | | |
|---|---|---|---|
| 2004/0140757 A1* | 7/2004 | Tyan | H01L 51/5265 313/504 |
| 2004/0217702 A1* | 11/2004 | Garner | H01L 51/5262 313/512 |
| 2006/0065900 A1* | 3/2006 | Hsieh | G02B 27/095 257/79 |
| 2007/0272921 A1* | 11/2007 | Furugori | H01L 51/5265 257/E33.001 |
| 2008/0272690 A1* | 11/2008 | Kuma | H01L 51/5265 313/504 |
| 2009/0058288 A1 | 3/2009 | Bertram et al. | |
| 2011/0049483 A1* | 3/2011 | Nishimura | C09B 1/00 257/40 |
| 2014/0225140 A1 | 8/2014 | Nishido et al. | |
| 2016/0093678 A1* | 3/2016 | Seo | H01L 51/5234 257/89 |
| 2016/0359091 A1* | 12/2016 | Hashiya | H01L 33/44 |
| 2017/0104035 A1* | 4/2017 | Lee | H01L 51/56 |
| 2018/0096648 A1* | 4/2018 | Kurokawa | G06F 1/3265 |
| 2018/0108709 A1* | 4/2018 | Choi | H01L 51/5275 |
| 2019/0131350 A1* | 5/2019 | Kwak | H01L 27/322 |
| 2021/0104697 A1* | 4/2021 | Ohsawa | H01L 51/5044 |
| 2021/0185776 A1* | 6/2021 | Lin | H01L 51/5012 |

FOREIGN PATENT DOCUMENTS

| | | |
|---|---|---|
| TW | 200715547 | 4/2007 |
| TW | M355846 | 5/2009 |

* cited by examiner

ILLUMINATION APPARATUS CAPABLE OF ILLUMINATING DIFFERENT LIGHTING PATTERNS

CROSS-REFERENCE TO RELATED APPLICATION

This application claims the priority benefits of U.S. provisional application Ser. No. 62/703,067, filed on Jul. 25, 2018, and Taiwan application serial no. 107141191, filed on Nov. 20, 2018. The entirety of each of the above-mentioned patent applications is hereby incorporated by reference herein and made a part of this specification.

BACKGROUND

Field of the Invention

The invention relates to an optical apparatus and more particularly, to an illumination apparatus.

Description of Related Art

Illumination apparatuses have been widely applied in daily life. For example, the illumination apparatuses may be applied in indoor illumination (for example, table lamps, etc.) or may be applied in outdoor illumination (for example, vehicle light-emitting elements, etc.). Along with the development of the illumination technologies, lighting patterns of the illumination apparatuses may be adjusted to provide illumination beams having suitable lighting patterns according to usage scenarios.

Taking the application in vehicles as an example, during a driving process, an active driving safety system is capable of comprehensively determining according to various driving statuses and instantly and dynamically adjusting a light-emitting direction and/or a light-emitting intensity of each vehicle light-emitting element (for example, headlight or taillight). In comparison with the convention illumination, adaptive illumination apparatuses capable of being adjusted according to the usage scenarios can dramatically enhance the safety for drivers and passengers.

A conventional adaptive illumination apparatus includes a light-emitting element (for example, a light-emitting diode array) and a light-modulation element (for example, a liquid crystal shutter) disposed outside the light-emitting element. Since the light-modulation element is disposed outside the light-emitting element, the assembly of the light-emitting element and the light-modulation element is complicated, which causes difficulty in reducing a volume of the illumination apparatus and restriction of an application range.

SUMMARY

The invention provides an illumination apparatus with preferable performance.

An illumination apparatus of the invention includes a transparent substrate, an opposite substrate and an electroluminescence structure disposed between the transparent substrate and the opposite substrate. The transparent substrate has a first region and a second region adjacent to the first region. The electroluminescence structure is disposed on the transparent substrate. The electroluminescence structure includes a first electrode disposed in the first region, an optical adjusting layer disposed in the second region, an organic electroluminescence layer disposed above the first electrode and the optical adjusting layer and a common electrode disposed above the organic electroluminescence layer. The optical adjusting layer is disposed between the organic electroluminescence layer and the transparent substrate.

In an embodiment of the invention, the electroluminescence structure further includes a second electrode disposed in the second region, wherein the second electrode is disposed between the organic electroluminescence layer and the transparent substrate, and the optical adjusting layer is adjacent to the second electrode.

In an embodiment of the invention, the optical adjusting layer contacts the second electrode.

In an embodiment of the invention, the second electrode is located between the organic electroluminescence layer and the optical adjusting layer.

In an embodiment of the invention, the optical adjusting layer is located between the organic electroluminescence layer and the second electrode.

In an embodiment of the invention, the optical adjusting layer includes a metal layer.

In an embodiment of the invention, the optical adjusting layer includes a refractivity layer, wherein a refractivity of the refractivity layer is greater than a refractivity of the transparent substrate.

In an embodiment of the invention, the optical adjusting layer includes a Bragg reflector.

In an embodiment of the invention, the optical adjusting layer configured to drive a portion of the organic electroluminescence layer disposed in the second region, and a reflectivity of the optical adjusting layer is greater than a reflectivity of the first electrode.

In an embodiment of the invention, a material of the optical adjusting layer and a material of the first electrode are different.

In an embodiment of the invention, the optical adjusting layer includes a metal layer, and the first electrode includes a transparent conductive layer.

In an embodiment of the invention, a thickness of the optical adjusting layer is smaller than a thickness of the first electrode.

In an embodiment of the invention, there is a first optical resonant cavity between the common electrode and the first electrode located in the first region, there is a second optical resonant cavity between the common electrode and the optical adjusting layer located in the second region, and a resonance strength of the second optical resonant cavity is greater than a resonance strength of the first optical resonant cavity.

In an embodiment of the invention, a lighting pattern of a first light beam emitted from the first region and a lighting pattern of a second light beam emitted from the second region are different.

In an embodiment of the invention, the second light beam emitted from the second region is more directional than the first light beam emitted from the first region.

In an embodiment of the invention, the organic electroluminescence layer disposed in a first portion of the first region receives a first electrical signal, the organic electroluminescence layer disposed in a second portion of the second region receives a second electrical signal, the first electrical signal is substantially identical to the second electrical signal, in a direction perpendicular to the transparent substrate, the first region has a first light intensity and the second region has a second light intensity, and the second light intensity is greater than the first light intensity.

In an embodiment of the invention, the illumination apparatus further includes an image sensing element and a processing and control element. The image sensing element is configured to receive an external image. The processing and control element is electrically connected between an image sensing element and the electroluminescence structure. A first portion of the organic electroluminescence layer is disposed in the first region, a second portion of the organic electroluminescence layer is disposed in the second region, and the processing and control element determines a first electrical signal input to the first portion of the organic electroluminescence layer and a second electrical signal input to the second portion of the organic electroluminescence layer according to the external image.

Based on the above, the light-emitting element of the illumination apparatus of one of the embodiments of the invention includes the transparent substrate, the opposite substrate and the electroluminescence structure disposed between the transparent substrate and the opposite substrate. The electroluminescence structure can provide an illumination beams having a desired lighting pattern. In other words, the light-emitting element itself can provide the illumination beam having the desired lighting pattern. The illumination apparatus can provide the illumination beam having the desired lighting pattern without any light-modulation element disposed outside the light-emitting element. Thus, the illumination apparatus of one of the embodiments of the invention can have a simple structure, a small volume and/or a wide application range.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

DESCRIPTION OF EMBODIMENTS

Figure 1:
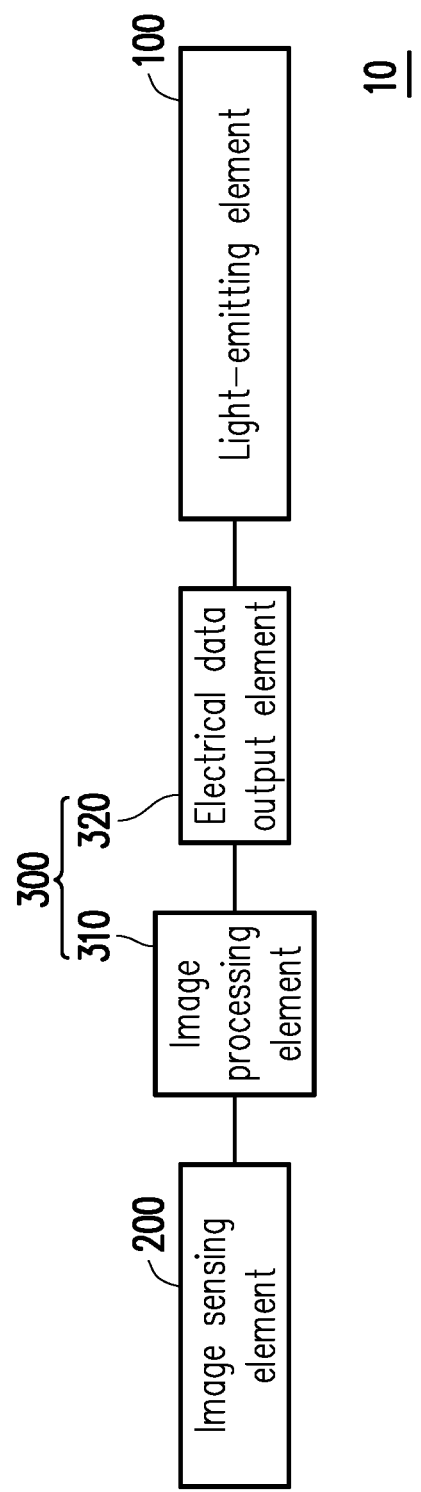
FIG. 1 is a schematic block view showing an illumination apparatus according to an embodiment of the invention.

References of the exemplary embodiments of the invention are made in detail. Examples of the exemplary embodiments are illustrated in the drawings. If possible, the same reference numerals in the drawings and the descriptions are indicated the same or similar parts.

It should be understood that when an element such as a layer, a film, an area, or a substrate is indicated to be "on" another element or "connected to" another element, it may be directly on another element or connected to another element, or an element in the middle may be existed. In contrast, when an element is indicated to be "directly on another element" or "directly connected to" another element, an element in the middle is not existed. For example, "connect" indicated in the specification may indicate physically and/or electrically connect. Furthermore, "electrically connect" or "coupled to" may be indicated that other element exists between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may be indicated that within one or more standard deviations of the value, or within ±30%, ±20%, ±10%, ±5%. Furthermore, the usages of "approximately", "similar to" or "substantially" indicated throughout the specification may be referred to a more acceptable deviation scope or standard deviation depending on optical properties, etching properties, or other properties, and all properties may not be applied with one standard deviation.

Unless otherwise defined, the terms used throughout the specification (including both technical and scientific terms) has the same meaning understood by people skilled in the art. It should be further understood that, terms such as those defined in commonly used dictionaries should be interpreted as having meanings consistent with the meanings in the prior art and the context of the invention, and shall not be interpreted as an idealized or overly formal meaning, unless they are definitely defined in the content.

Figure 2:
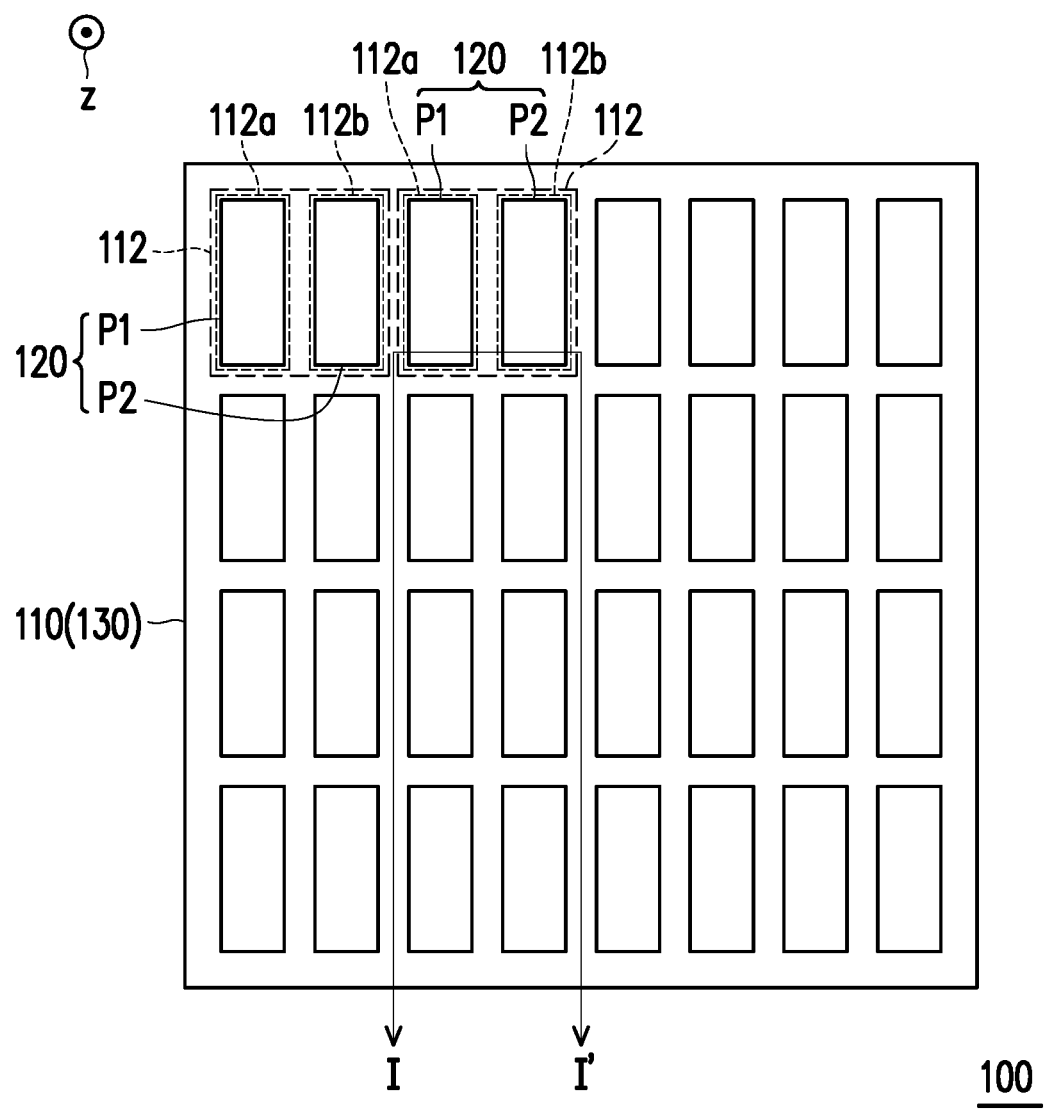
FIG. 2 is a schematic top view showing a light-emitting element of the illumination apparatus according to an embodiment of the invention.
Figure 3:
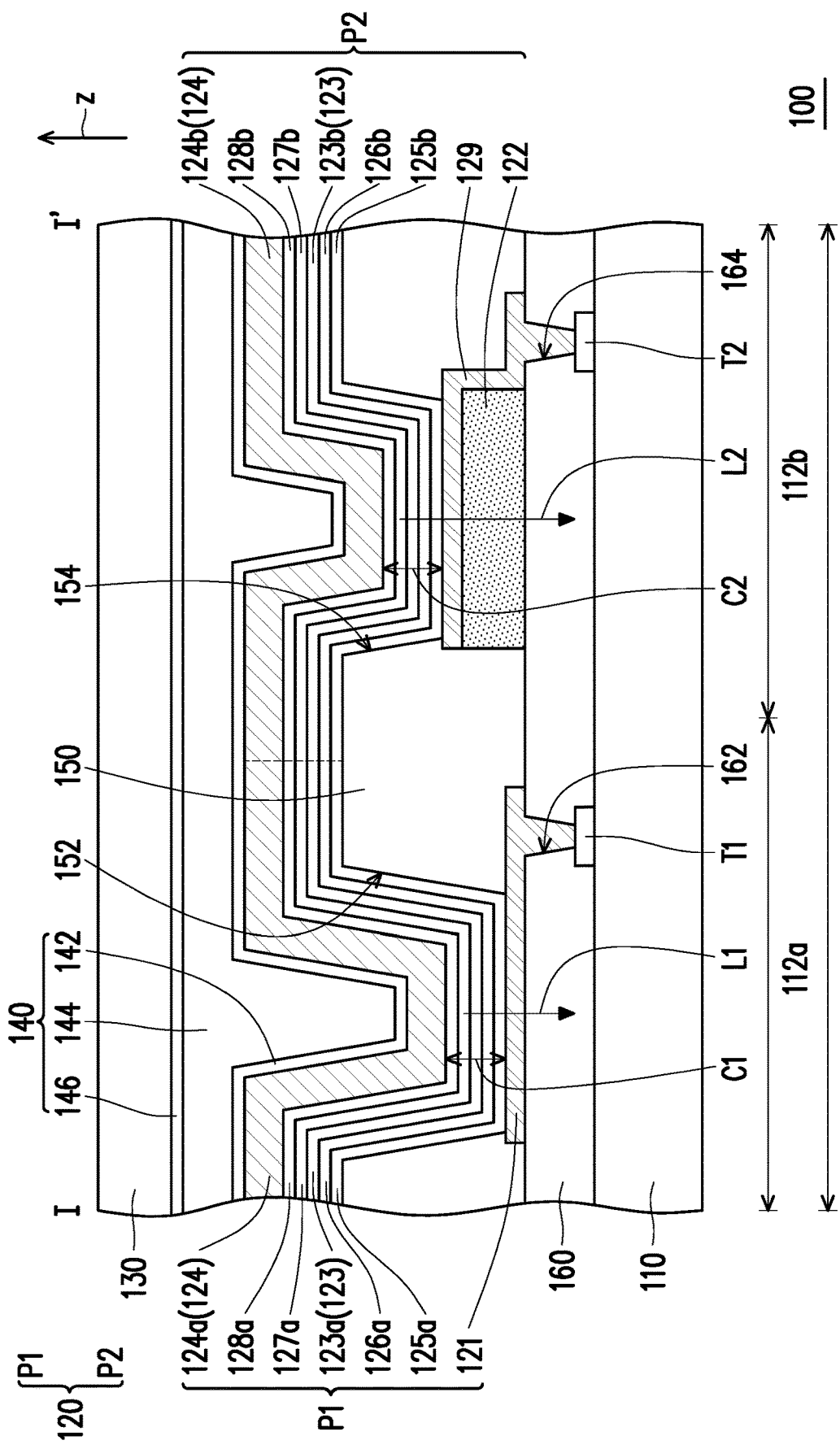
FIG. 3 is a schematic cross-sectional view showing the light-emitting element according to a cross-sectional line I-I' in FIG. 2.

Referring to FIG. 1, FIG. 2 and FIG. 3, FIG. 1 is a schematic block view showing an illumination apparatus according to an embodiment of the invention, FIG. 2 is a schematic top view showing a light-emitting element of the illumination apparatus according to an embodiment of the invention, and FIG. 3 is a schematic cross-sectional view showing the light-emitting element according to a cross-sectional line I-I' in FIG. 2.

Referring to FIG. 2 and FIG. 3, an illumination apparatus 10 includes a light-emitting element 100, and the light-emitting element 100 includes a transparent substrate 110, a plurality of electroluminescence structures 120 and an opposite substrate 130. The electroluminescence structures 120 are disposed on the transparent substrate 110. The opposite substrate 130 is disposed opposite to the transparent substrate 110. The electroluminescence structures 120 are disposed between the transparent substrate 110 and the opposite substrate 130. The transparent substrate 110 and the opposite substrate 130 may be rigid substrates or flexible substrates, depending the application of the illumination apparatus 10. In the present embodiment, a material of the transparent substrate 110 may be selected from a material having a high transmittance, for example but not limited to, glass, plastic, etc. In the present embodiment, a material of the opposite substrate 130 may be selected from a material having a high transmittance or a high reflectivity, which is not particularly limited in the invention. For instance, if being packaged by using glass, the opposite substrate 130 may be made of glass, and if being packaged by using a thin film, the opposite substrate 130 may be integrated with a polarizer or a protective film.

Referring to FIG. 3, in the present embodiment, the light-emitting element 100 may further selectively include a package structure 140 disposed on the electroluminescence structures 120. The package structure 140 is configured to isolate humidity, impurities and so on. For instance, in the present embodiment, the package structure 140 may include a first inorganic layer 142, an organic layer 144 and a second inorganic layer 146. The organic layer 144 is located between the first inorganic layer 142 and the second inorganic layer 146, and the second inorganic layer 146 is located on the organic layer 144. A material of the first inorganic layer 142 includes, for example but not limited to, silicon nitride or aluminum oxide, a material of the organic layer 144 includes, for example but not limited to, an acrylic resin, an epoxy resin or carbon silicon oxide, and a material of the second inorganic layer 146 includes, for example but not limited to, silicon nitride or aluminum oxide. However, the invention is not limited thereto, and in other embodiments, the package structure 140 may be other types of structures.

Referring to FIG. 2 and FIG. 3, the transparent substrate 110 has a plurality of unit regions 112. Each of the unit regions 112 includes a first region 112a and a second region 112b adjacent to each other. The electroluminescence structures 120 are respectively disposed in the unit regions 112 of the transparent substrate 110. In the present embodiment, each of the electroluminescence structures 120 includes a first portion P1 and a second portion P2 which are respectively disposed in the first region 112a and the second region 112b of one of the unit regions 112. The first portion P1 and the second portion P2 of each of the electroluminescence structures 120 are electrically independent from each other. In other words, the first portion P1 and the second portion P2 of each of the electroluminescence structures 120 may be driven separately. The first portion P1 and the second portion P2 of each of the electroluminescence structures 120 are electrically connected to an active element T1 and active element T2, respectively. The active element T1 and the active element T2 includes, for example but not limited to, thin film transistors. Referring to FIG. 3, for instance, in the present embodiment, the light-emitting element 100 further includes a planar layer 160 disposed on the active element T1 and the active element T2. The planar layer 160 has a contact window 162 overlapping with the active element T1 and a contact window 164 overlapping with the active element T2, and the first portion P1 and the second portion P2 may be electrically connected to the active element T1 and the active element T2 respectively through the contact window 162 and the contact window 164, but the invention is not limited thereto.

Referring to FIG. 3, the first portion P1 of the electroluminescence structure 120 includes a first electrode 121 disposed in the first region 112a, an organic electroluminescence pattern 123a disposed in the first region 112a and a common electrode pattern 124a disposed in the first region 112a, wherein the organic electroluminescence pattern 123a is disposed above the first electrode 121, and the common electrode pattern 124a is disposed above the organic electroluminescence pattern 123a. In the present embodiment, the first portion P1 of the electroluminescence structure 120 may further selectively include a hole injection pattern 125a, a hole transmission pattern 126a, an electronic transmission pattern 127a and electron injection pattern 128a, wherein the first electrode 121, the hole injection pattern 125a, the hole transmission pattern 126a, the organic electroluminescence pattern 123a, the electronic transmission pattern 127a, the electron injection pattern 128a and the common electrode pattern 124a are stacked along a direction z which departs away from the transparent substrate 110. However, the invention is not limited thereto, and in other embodiments, the first portion P1 of the electroluminescence structure 120 may also use other suitable structures.

Referring to FIG. 3, the second portion P2 of the electroluminescence structure 120 includes an optical adjusting layer 122 disposed in the second region 112b, an organic electroluminescence pattern 123b disposed in the second region 112b and a common electrode pattern 124b disposed in the second region 112b, wherein the organic electroluminescence pattern 123b is disposed above the optical adjusting layer 122, and the common electrode pattern 124b is disposed above the organic electroluminescence pattern 123b. In the present embodiment, the second portion P2 of the electroluminescence structure 120 may further selectively include a second electrode 129, a hole injection pattern 125b, a hole transmission pattern 126b, an electronic transmission pattern 127b and an electron injection pattern 128b, wherein the second electrode 129, the hole injection pattern 125b, the hole transmission pattern 126b, the organic electroluminescence pattern 123b, the electronic transmission pattern 127b, the electron injection pattern 128b and the common electrode pattern 124b are stacked along the direction z which departs away from the transparent substrate 110. However, the invention is not limited thereto, and in other embodiments, the second portion P2 of the electroluminescence structure 120 may also use other suitable structures.

In the present embodiment, the first portion P1 and the second portion P2 may be selectively configured to emit a first light beam L1 and a second light beam L2 having the same color, and the organic electroluminescence pattern 123a of the first portion P1 and the organic electroluminescence pattern 123b of the second portion P2 may be selectively formed in the same organic electroluminescence layer 123 and connected with each other. However, the invention is not limited thereto. In an embodiment, the organic electroluminescence pattern 123a of the first portion P1 and the organic electroluminescence pattern 123b of the second portion P2 may also respectively emit different colors. In an embodiment, the organic electroluminescence pattern 123a of the first portion P1 and the organic electroluminescence pattern 123b of the second portion P2 may also be separated from each other.

The common electrode pattern 124a of the first portion P1 and the common electrode pattern 124b of the second portion P2 are electrically connected with each other. For instance, in the present embodiment, the common electrode pattern 124a of the first portion P1 and the common electrode pattern 124b of the second portion P2 may be formed in the same common electrode layer 124 and connected with each other, but the invention is not limited thereto. Additionally, in the present embodiment, the first electrode 121 and the second electrode 129 may be selectively formed in the transparent conductive layer and separated from each other. However, the invention is not limited thereto, and in other embodiments, the first electrode 121 and the second electrode 129 may also be selectively formed in different film layers.

Referring to FIG. 3, in the present embodiment, the light-emitting element 100 may further include a pixel defining layer 150 disposed on the first electrode 121 and the second electrode 129. In the present embodiment, the pixel defining layer 150 has a first opening 152 overlapping with the first electrode 121 and a second opening 154 overlapping with the second electrode 129. The first portion P1 and the second portion P2 of the electroluminescence structure 120 may be respectively located on the first opening 152 and the second opening 154 of the pixel defining layer 150. For instance, in the present embodiment, a material of the pixel defining layer 150 may include a photosensitive polyimide material, a propenyl material, a siloxanyl material, a phenol resin material, oxide, nitride or nitrogen oxide, but the invention is not limited thereto.

It should be noted that the second portion P2 of the electroluminescence structure 120 includes the optical adjusting layer 122 disposed between the organic electroluminescence layer 123 and the transparent substrate 110. For instance, in the present embodiment, the second electrode 129 is disposed between the organic electroluminescence layer 123 and the transparent substrate 110, and the optical adjusting layer 122 is adjacent to the second electrode 129. The optical adjusting layer 122 may contact the second electrode 129. The second electrode 129 may be located between the organic electroluminescence layer 123 and the optical adjusting layer 122, but the invention is not limited thereto. For instance, in the present embodiment, the optical adjusting layer 122 may include a transparent metal layer having a refractivity layer or a Bragg reflector having a refractivity greater than a refractivity of the transparent substrate 110, but the invention is not limited thereto.

The optical adjusting layer 122 is capable of making a lighting pattern of the second light beam L2 emitted from the second portion P2 different from a lighting pattern of the first light beam L1 emitted from the first portion P1. To be detailed, with the disposition of the optical adjusting layer 12, the second light beam L2 emitted from the organic electroluminescence pattern 123b and transmitted toward the transparent substrate 110 has a higher proportion which is reflected by the second electrode 129, the optical adjusting layer 122 and/or a boundary of the second electrode 129 and the optical adjusting layer 122 back to the organic electroluminescence pattern 123b. The second light beam L2 which is reflected by the second electrode 129, the optical adjusting layer 122 and/or the boundary of the second electrode 129 and the optical adjusting layer 122 back to the organic electroluminescence pattern 123b is reflected back and forth between the common electrode pattern 124b and the second electrode 129, between the common electrode pattern 124b and the optical adjusting layer 122 and/or between the common electrode pattern 124b and the boundary of the second electrode 129 and the optical adjusting layer 122. In other words, at least a portion of a second optical resonant cavity C2 which is significant is between the common electrode pattern 124b and the optical adjusting layer 122. Similarly, there is a first optical resonant cavity C1 between the common electrode 124a and the first electrode 121 located in the first region 112a. Additionally, a resonance strength of the second optical resonant cavity C2 is greater than a resonance strength of the first optical resonant cavity C1. The second light beam L2 emitted from the second region 112b of the transparent substrate 110 (alternatively, the second light beam L2 emitted from the significant second optical resonant cavity C2) is more directional than the first light beam L1 emitted from the first region 112a of the transparent substrate 110. In other words, the organic electroluminescence pattern 123a receives the first electrical signal, and the organic electroluminescence pattern 123b receives the second electrical signal. When the first electrical signal is substantially identical to the second electrical signal. In the direction z perpendicular to transparent substrate 110, the first light beam L1 emitted from the first region 112a has a first light intensity, the second light beam L2 emitted from the second region 112b has a second light intensity, and the second light intensity is greater than the first light intensity.

Figure 4:
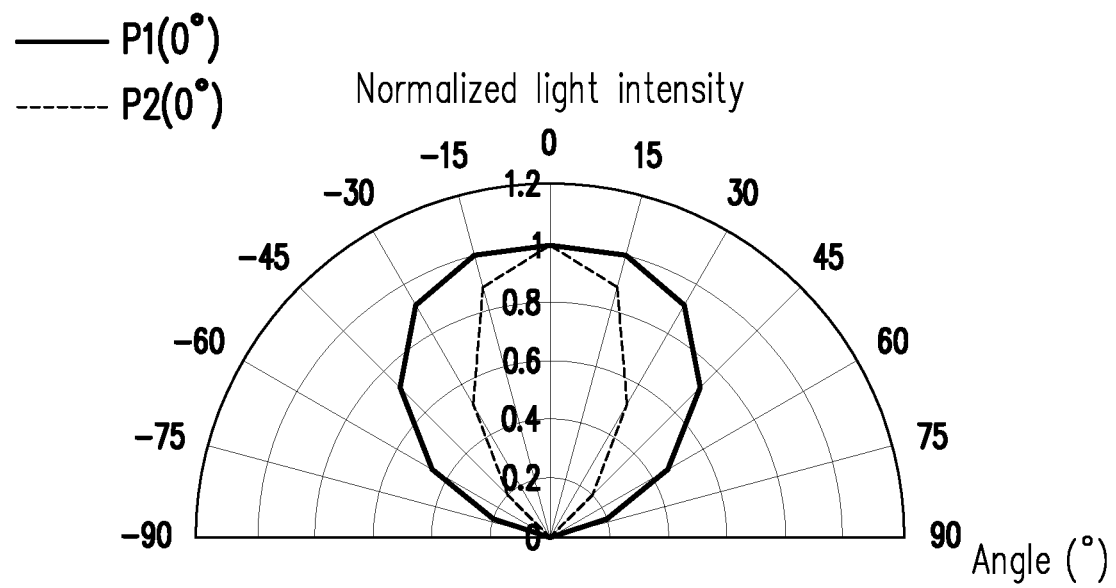
FIG. 4 is a polar coordinate graph showing normalized light intensities of the first light beam LI and the second light beam L2 emitted from the first portion P1 and the second portion P2 of the light-emitting element according to an embodiment of the invention.

FIG. 4 is a polar coordinate graph showing normalized light intensities of the first light beam L1 and the second light beam L2 emitted from the first portion P1 and the second portion P2 of the light-emitting element according to an embodiment of the invention. Referring to FIG. 3 and FIG. 4, the second light beam L2 emitted from the second portion P2 of the light-emitting element 100 is concentrated in a narrow angle range (for example, −30° to 30°), and the first light beam L1 emitted from the first portion P1 of the light-emitting element 100 is dispersed in a wide angular range (for example, −60° to 60°). In other words, the second light beam L2 emitted from the second portion P2 located in the second region 112b is more directional than the first light beam L1 emitted from the first portion P1 located in the first region 112a.

The first light beam L1 emitted from the first portion P1 of the light-emitting element 100 has a maximum light intensity in a direction with an angle of θ1. The second light beam L2 emitted from the second portion P2 of the light-emitting element 100 has a maximum light intensity in a direction with an angle of θ2. For instance, in the embodiment illustrated in FIG. 4, both the angle θ1 and the angle θ2 may be 0°, selectively. In other words, the first light beam L1 emitted from the first portion P1 of the light-emitting element 100 has the maximum light intensity in a direction with an angle of 0°, and the second light beam L2 emitted from the second portion P2 of the light-emitting element 100 has the maximum light intensity in a direction with an angle of 0°. However, the invention is not limited thereto. Referring to FIG. 3, the angle θ1 may be adjusted by controlling optical parameters (for example but not limited to, a refractivity and a thickness) of the organic layer (for example but not limited to, at least one of the hole injection pattern 125a, the hole transmission pattern 126a, the organic electroluminescence pattern 123a, the electronic transmission pattern 127a and the electron injection pattern 128a) of the first portion P1, and the angle θ2 may be adjusted by controlling optical parameters (for example but not limited to, a refractivity and a thickness) of the organic layer (for example but not limited to, at least one of the hole injection pattern 125b, the hole transmission pattern 126b, the organic electroluminescence pattern 123b, the electronic transmission pattern 127b and the electron injection pattern 128b) of the second portion P2 or optical parameters (for example but not limited to, a refractivity, a reflectivity and a thickness) of the optical adjusting layer 122.

Figure 5:
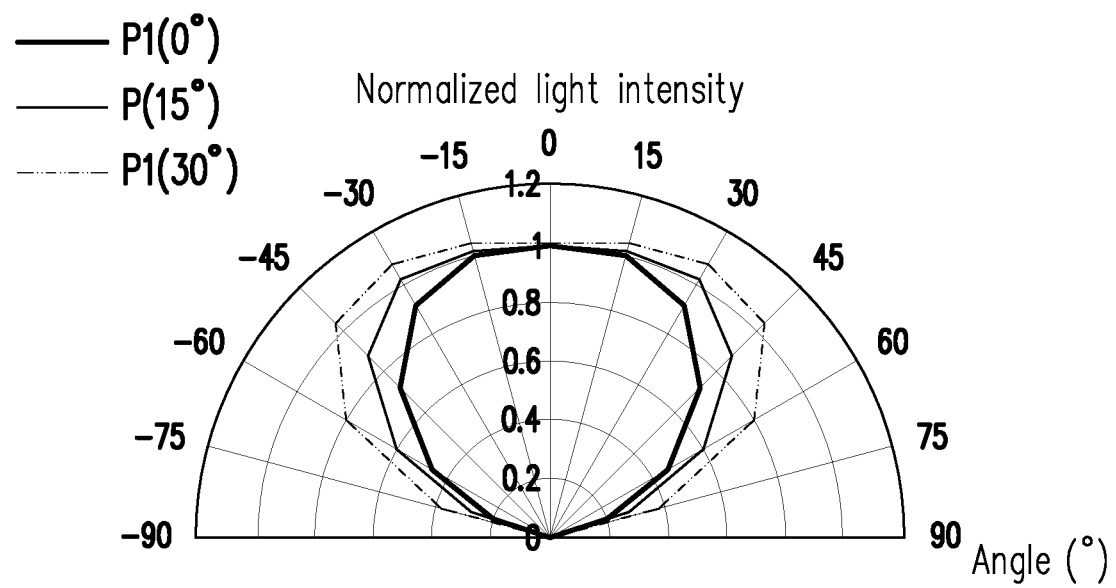
FIG. 5 is a polar coordinate graph showing a normalized light intensity of the first light beam LI emitted from the first portion P1 of the light-emitting element in a condition that the electronic transmission pattern 127a has different thicknesses according to an embodiment of the invention.
Figure 6:
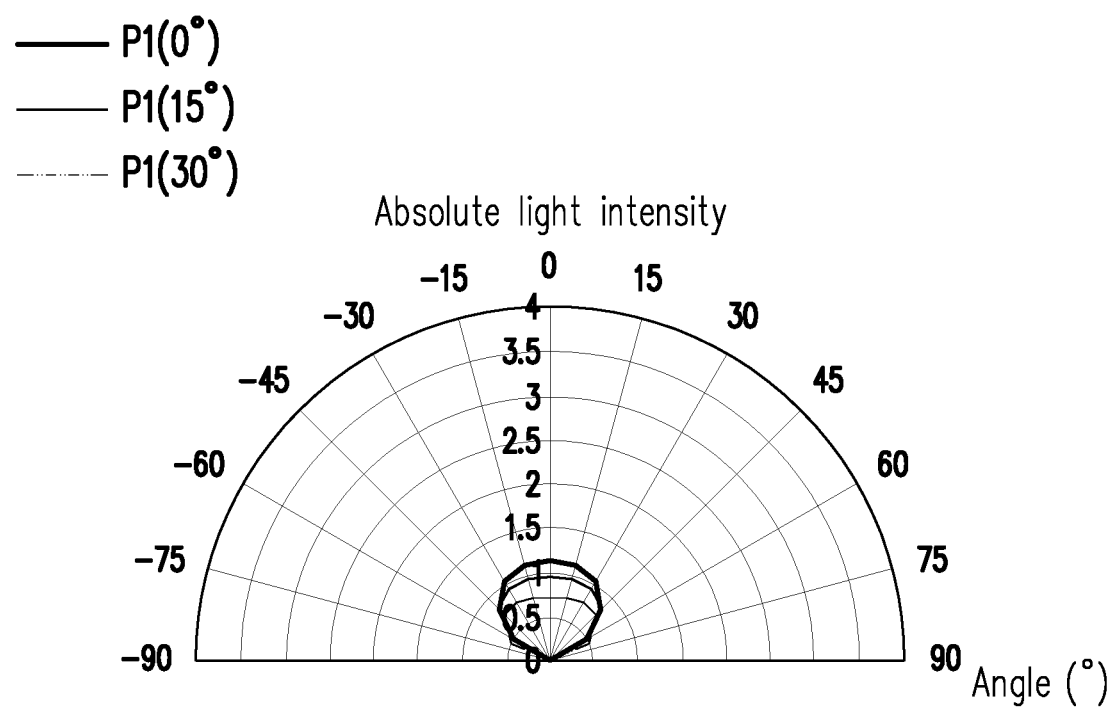
FIG. 6 is a polar coordinate graph showing an absolute light intensity of the first light beam LI emitted from the first portion P1 of the light-emitting element in a condition that the electronic transmission pattern 127a has different thicknesses according to an embodiment of the invention.

For instance, FIG. 5 is a polar coordinate graph showing a normalized light intensity of the first light beam L1 emitted from the first portion P1 of the light-emitting element in a condition that the electronic transmission pattern 127a has different thicknesses according to an embodiment of the invention, and FIG. 6 is a polar coordinate graph showing an absolute light intensity of the first light beam L1 emitted from the first portion P1 of the light-emitting element in a condition that the electronic transmission pattern 127a has different thicknesses according to an embodiment of the invention. Referring to FIG. 3, FIG. 5 and FIG. 6, as the thickness of the electronic transmission pattern 127a is increased, the angle θ1 is increased. For instance, as the thickness of the electronic transmission pattern 127a is increased, the angle θ1 may be increased from 0° to 15° and then, increased from 15° to 30°.

Referring to FIG. 1, in the present embodiment, in addition to the light-emitting element 100, the illumination apparatus 10 may further selectively include an image sensing element 200 and a processing and control element 300. The image sensing element 200 is configured to receive an external image. The processing and control element 300 is electrically connected between an image sensing element 200 and the electroluminescence structures 120 of the light-emitting element 100. In the present embodiment, the processing and control element 300 may include an image processing element 310 and an electrical data output element 320, wherein the image processing element 310 is electrically connected between the image sensing element 200 and the electrical data output element 320, and the electrical data output element 320 is electrically connected between the image processing element 310 and the light-emitting element 100.

With the light-emitting element 100, the image sensing element 200 and the processing and control element 300 operated in collaboration, an adaptive illumination apparatus 10, for example but not limited to, adaptive headlight or taillight can be achieved. To be detailed, the image sensing element 200 captures an external image, and the processing and control element 300 may determine the first electrical signal input to the first portion P1 (or referred to as the organic electroluminescence pattern 123a disposed in the first region 112a) of the light-emitting element 100 and the second electrical signal input to the second portion P2 (or referred to as the organic electroluminescence pattern 123b disposed in the second region 112b ) of the light-emitting element 100 according to the external image, such that the overall light-emitting element 100 emits an illumination beam having a desired lighting pattern.

Figure 7:
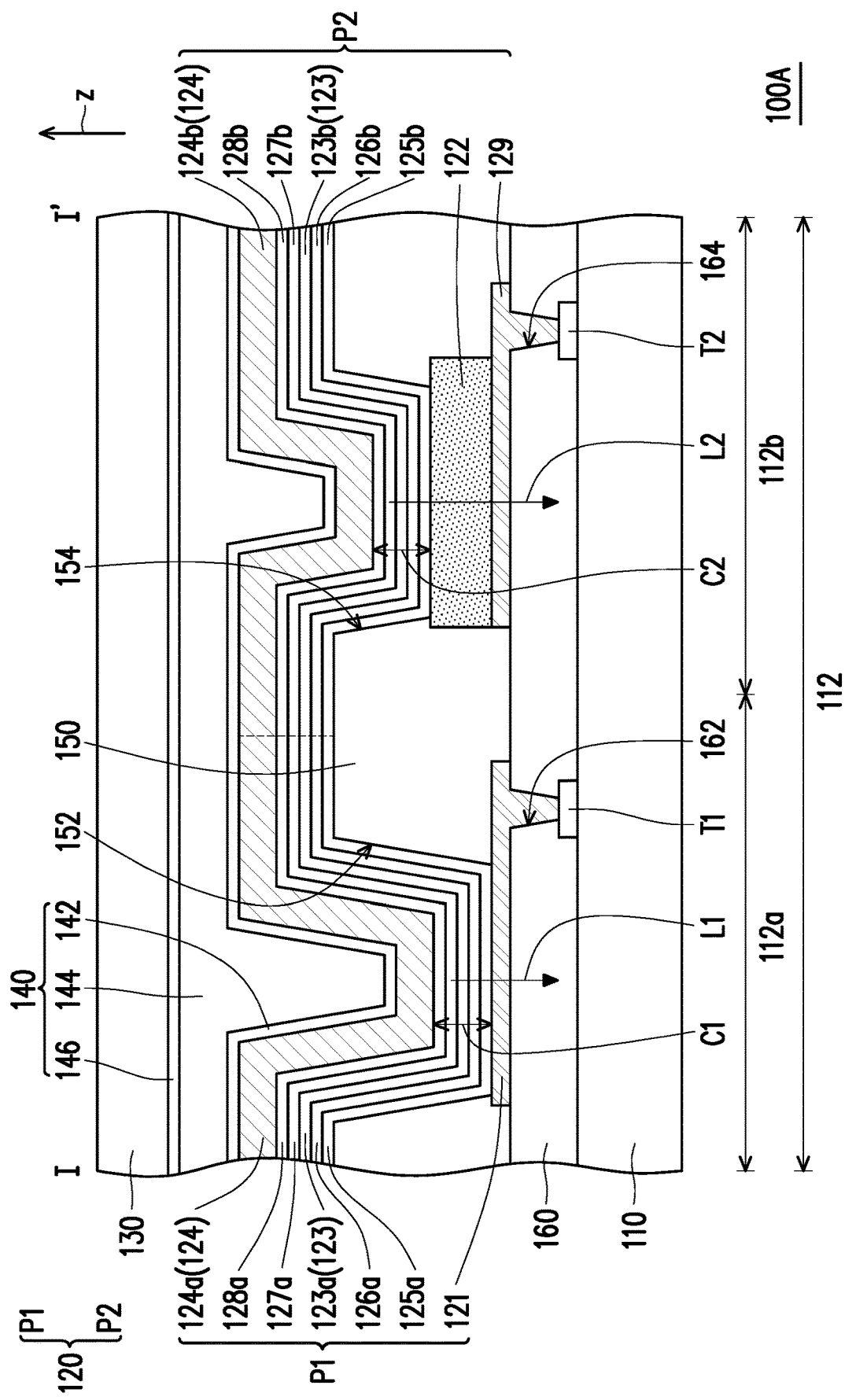
FIG. 7 is a schematic cross-sectional view showing a light-emitting element of the illumination apparatus according to another embodiment of the invention.

FIG. 7 is a schematic cross-sectional view showing a light-emitting element of the illumination apparatus according to another embodiment of the invention. Referring to FIG. 3 and FIG. 7, a light-emitting element 100A illustrated in FIG. 7 is similar to the light-emitting element 100 illustrated in FIG. 3, and the main difference therebetween lies in that the optical adjusting layer 122 of the light-emitting element 100A is disposed on the second electrode 129. In other words, in the embodiment illustrated in FIG. 7, the optical adjusting layer 122 is located between the organic electroluminescence layer 123 and the second electrode 129. The light-emitting element 100A of the present embodiment has effects and advantages similar to those of the light-emitting element 100 described above and may also be selectively operated in collaboration with the image sensing element 200 and the processing and control element 300 described above, so as to achieve an adaptive illumination apparatus.

Figure 8:
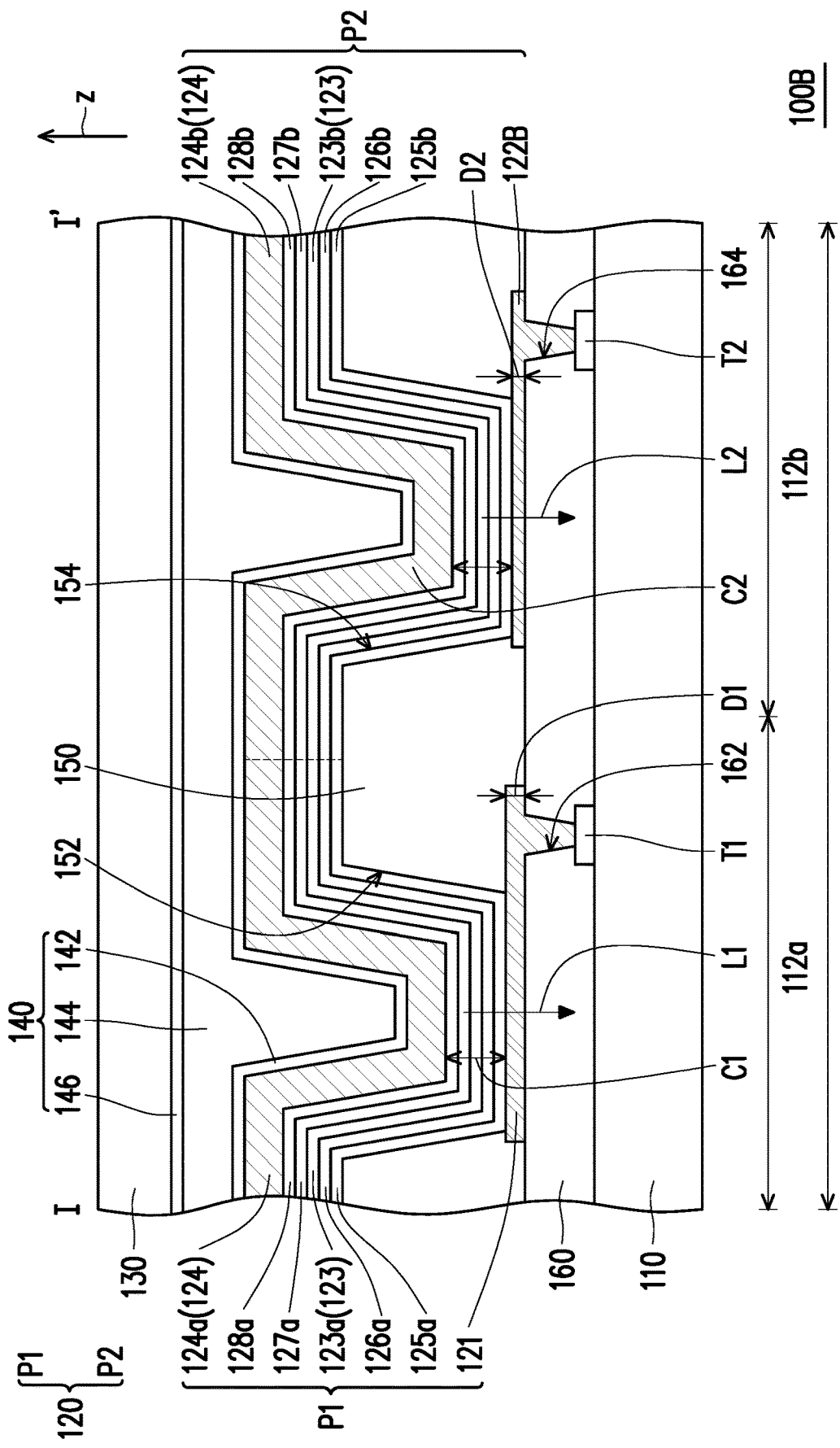
FIG. 8 is a schematic cross-sectional view showing a light-emitting element of the illumination apparatus according to yet another embodiment of the invention.

FIG. 8 is a schematic cross-sectional view showing a light-emitting element of the illumination apparatus according to yet another embodiment of the invention. Referring to FIG. 3 and FIG. 8, a light-emitting element 100B illustrated in FIG. 8 is similar to the light-emitting element 100 illustrated in FIG. 3, and the main difference therebetween lies in that the light-emitting element 100B may not include the second electrode 129 illustrated in FIG. 3. In the embodiment illustrated in FIG. 8, an optical adjusting layer 122B of the light-emitting element 100B has conductivity, and the optical adjusting layer 122B may be further used as an electrode for driving the organic electroluminescence pattern 123b.

Referring to FIG. 8, in the present embodiment, the optical adjusting layer 122B is configured to drive a portion of the organic electroluminescence layer 123 (i.e., the organic electroluminescence pattern 123b) disposed in the second region 112b, and a reflectivity of the optical adjusting layer 122B is greater than a reflectivity of the first electrode 121. For instance, a material of the optical adjusting layer 122B and a material of the first electrode 121 are different. The optical adjusting layer 122B includes a metal layer, and the first electrode 121 includes a transparent conductive layer (for example but not limited to, indium tin oxide (ITO)). A thickness D2 of the optical adjusting layer 122B may be smaller than a thickness D1 of the first electrode 121, but the invention is not limited thereto. The light-emitting element 100B of the present embodiment has effects and advantages similar to those of the light-emitting element 100 described above and may also be selectively operated in collaboration with the image sensing element 200 and the processing and control element 300 described above, so as to achieve an adaptive illumination apparatus.

Figure 9:
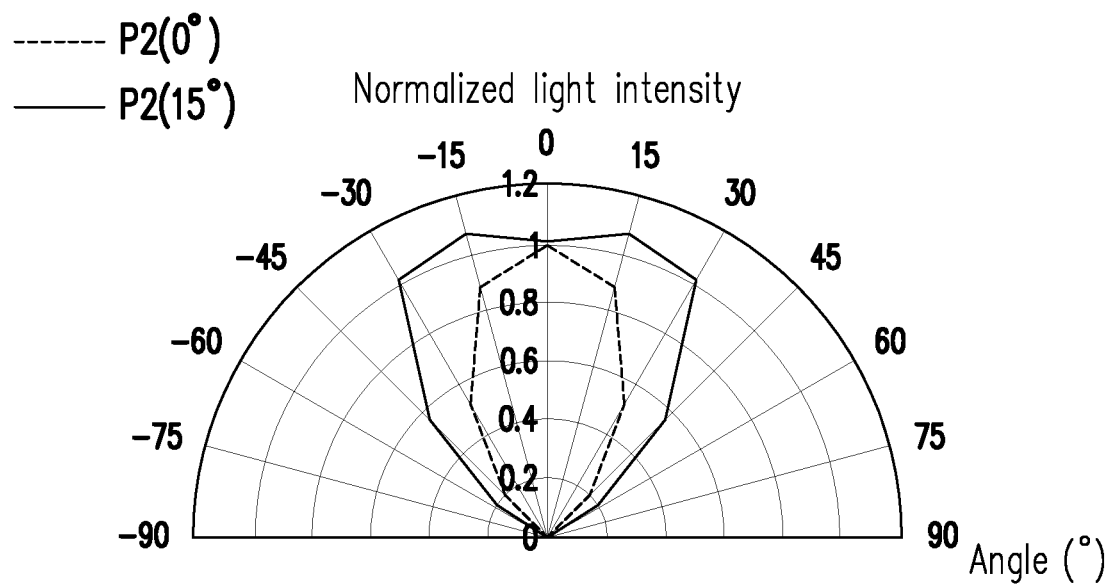
FIG. 9 is a polar coordinate graph of the normalized light intensity of the second light beam L2 emitted from the second portion P2 of the light-emitting element in a condition that the optical adjusting layer 122B has different thicknesses according to an embodiment of the invention.
Figure 10:
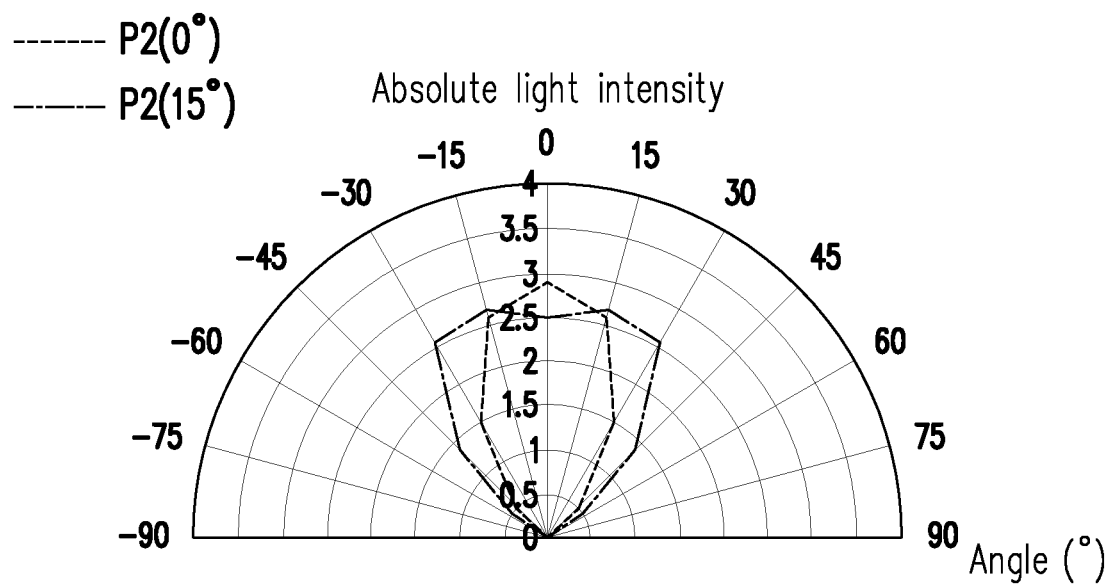
FIG. 10 is a polar coordinate graph of an absolute light intensity of the second light beam L2 emitted from the second portion P2 of the light-emitting element in a condition that the optical adjusting layer 122B has different thicknesses according to an embodiment of the invention.

For instance, FIG. 9 is a polar coordinate graph of the normalized light intensity of the second light beam L2 emitted from the second portion P2 of the light-emitting element in a condition that the optical adjusting layer 122B has different thicknesses according to an embodiment of the invention, and FIG. 10 is a polar coordinate graph of an absolute light intensity of the second light beam L2 emitted from the second portion P2 of the light-emitting element in a condition that the optical adjusting layer 122B has different thicknesses according to an embodiment of the invention. Referring to FIG. 8, FIG. 9 and FIG. 10, as the thickness of the optical adjusting layer 122B is reduced, the angle θ2 is increased. For instance, as the thickness of the optical adjusting layer 122B is reduced, the angle θ2 may be increased from 0° to 15°.

Figure 11:
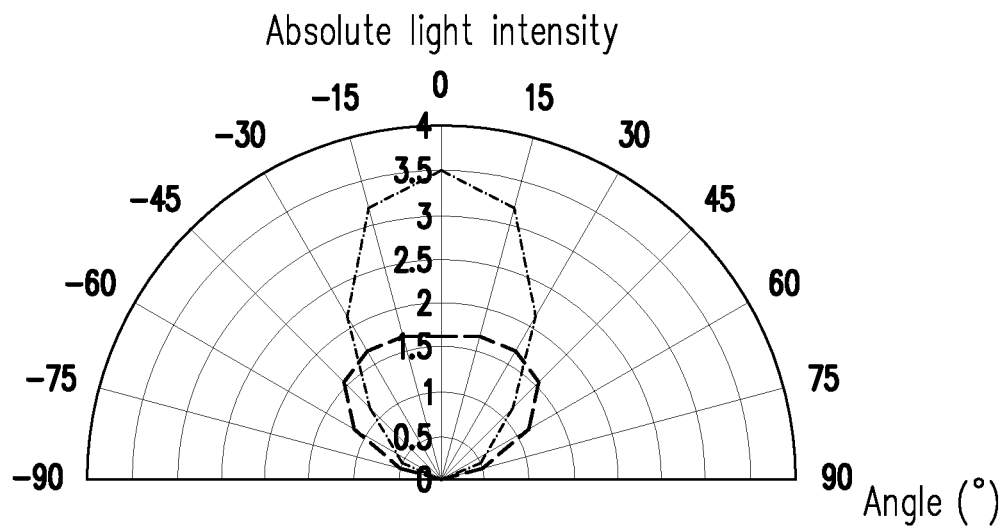
FIG. 11 is a polar coordinate graph of an absolute light intensity of an illumination beam formed by mixing the first light beam L1 having θ1=30° and the second light beam L2 having θ2=0° and an absolute light intensity of an illumination beam formed by mixing the first light beam L1 having θ1=15° and another first light beam L1 having θ2=30°.

FIG. 11 is a polar coordinate graph of an absolute light intensity of an illumination beam formed by mixing the first light beam L1 having θ1=30° and the second light beam L2 having θ2 =0° and an absolute light intensity of an illumination beam formed by mixing the first light beam L1 having θ1=15° and another first light beam L1 having θ2 =30°.

Referring to FIG. 11, for instance, the overall light-emitting element may achieve emitting an illumination beam having a higher directivity (which is represented by a line labelled by P1)(30°)+P2 (0°) by mixing the first light beam L1 emitted from the first portion P1 which has the angle θ1=30° and the second light beam L2 emitted from second portion P2 which has the angle θ2 =0°. The overall light-emitting element may achieve emitting an illumination beam having a lower directivity (which is represented by a line labelled by P1)(15°)+P1 (30°) by mixing the first light beam L1 emitted from the first portion P1 of one of the electroluminescence structures 120 of the light-emitting element which has the angle θ1=15° and the first light beam L1 emitted from the first portion P1 of another one of the electroluminescence structures 120 which has the angle θ1=30°, and a lighting pattern thereof is close to a lighting pattern of a light beam emitted by a Lambertian light source. However, the invention is not limited thereto. An electroluminescence structure 120, in addition the first portion P1 and the second portion P2, may further include other parts. The illumination beam emitted by the overall light-emitting element 100 may also be formed by mixing the first light beam, the second light beam and other light beams respectively emitted by the first portion P1, the second portion P2 and other parts.

In light of the forgoing, the light-emitting element of the illumination apparatus of one of the embodiments of the invention includes the transparent substrate, the opposite substrate and the electroluminescence structure disposed between the transparent substrate and the opposite substrate. The electroluminescence structure includes the first portion disposed in the first region of the transparent substrate and the second portion disposed in the second region of the transparent substrate. The first portion and the second portion of the electroluminescence structure is configured to emit the first light beam and the second light beam. The second portion of the electroluminescence structure includes the optical adjusting layer, such that the lighting pattern of the second light beam emitted from the second portion of the electroluminescence structure is different from the lighting pattern of the first light beam emitted from the first portion of the electroluminescence structure. The illumination beam having the desired lighting pattern may be provide by the first light beam, the second light beam or a combination thereof.

It should be noted that the electroluminescence structure capable of providing the illumination beam having the desired lighting pattern is disposed between the transparent substrate and the opposite substrate. In other words, In other words, the light-emitting element itself can provide the illumination beam having the desired lighting pattern. The illumination apparatus can provide the illumination beam having the desired lighting pattern without any light-modulation element disposed outside the light-emitting element. Thus, the illumination apparatus of one of the embodiments of the invention can have a simple structure, a small volume and/or a wide application range.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An illumination apparatus, comprising:
    a transparent substrate, having a first region and a second region adjacent to each other;
    a electroluminescence structure, disposed on the transparent substrate, wherein the electroluminescence structure comprises:
    a first electrode, disposed in the first region;
    an optical adjusting layer, disposed in the second region;
    an organic electroluminescence layer, disposed above the first electrode and the optical adjusting layer, wherein the optical adjusting layer is disposed between the organic electroluminescence layer and the transparent substrate; and
    a common electrode, disposed above the organic electroluminescence layer; and
    an opposite substrate, wherein the electroluminescence structure is disposed between the transparent substrate and the opposite substrate,
    wherein a first portion of the electroluminescence structure includes the first electrode disposed in the first region, a first portion of the organic electroluminescence layer disposed in the first region and a first portion of the common electrode disposed in the first region, the first portion of the organic electroluminescence layer is disposed above the first electrode, and the first portion of the common electrode is disposed above the first portion of the organic electroluminescence layer;
    a second portion of the electroluminescence structure includes the optical adjusting layer disposed in the second region, a second portion of the organic electroluminescence layer disposed in the second region and a second portion of the common electrode disposed in the second region, the second portion of the organic electroluminescence layer is disposed above the optical adjusting layer, [[and]] the second portion of the common electrode is disposed above the second portion of the organic electroluminescence layer, and the first portion and the second portion of the organic electroluminescence layer emit a singular color light beam;
    a first light beam of the singular color light beam emitted from the first portion is dispersed in a wide angular range, and a second light beam of the singular color light beam emitted from the second portion is concentrated in a narrow angular range;
    wherein the optical adjusting layer is configured to drive the second portion of the organic electroluminescence layer disposed in the second region, and a reflectivity of the optical adjusting layer is greater than a reflectivity of the first electrode.

2. The illumination apparatus according to claim 1, wherein the optical adjusting layer comprises a metal layer.

3. The illumination apparatus according to claim 1, wherein the optical adjusting layer comprises a refractivity layer, wherein a refractivity of the refractivity layer is greater than a refractivity of the transparent substrate.

4. The illumination apparatus according to claim 1, wherein a material of the optical adjusting layer and a material of the first electrode are different.

5. The illumination apparatus according to claim 1, wherein the optical adjusting layer comprises a metal layer, and the first electrode comprises a transparent conductive layer.

6. The illumination apparatus according to claim 1, wherein a thickness of the optical adjusting layer is smaller than a thickness of the first electrode.

7. The illumination apparatus according to claim 1, wherein there is a first optical resonant cavity between the common electrode and the first electrode located in the first region, there is a second optical resonant cavity between the common electrode and the optical adjusting layer located in the second region, and a resonance strength of the second optical resonant cavity is greater than a resonance strength of the first optical resonant cavity.

8. The illumination apparatus according to claim 1, wherein the second light beam emitted from the second region is more directional than the first light beam emitted from the first region.

9. The illumination apparatus according to claim 1, wherein the first portion of the organic electroluminescence layer disposed in the first region receives a first electrical signal, the second portion of the organic electroluminescence layer disposed in the second region receives a second electrical signal, the first electrical signal is substantially identical to the second electrical signal, the first region has a first light intensity and the second region has a second light intensity in a direction perpendicular to the transparent substrate, and the second light intensity is greater than the first light intensity.

10. The illumination apparatus according to claim 1, further comprising:
- an image sensing element, configured to receive an external image; and
- a processing and control element, electrically connected between an image sensing element and the electroluminescence structure, wherein the first portion of the organic electroluminescence layer is disposed in the first region, the second portion of the organic electroluminescence layer is disposed in the second region, and the processing and control element determines a first electrical signal input to the first portion of the organic electroluminescence layer and a second electrical signal input to the second portion of the organic electroluminescence layer according to the external image.

* * * * *